(12) United States Patent
Hirler et al.

(10) Patent No.: US 7,655,975 B2
(45) Date of Patent: Feb. 2, 2010

(54) POWER TRENCH TRANSISTOR

(75) Inventors: Franz Hirler, Isen (DE); Wolfgang Werner, München (DE); Markus Zundel, Egmating (DE); Frank Pfirsch, München (DE)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 11/264,756

(22) Filed: Oct. 31, 2005

(65) Prior Publication Data

US 2006/0118864 A1     Jun. 8, 2006

(30) Foreign Application Priority Data

Oct. 29, 2004   (DE)  ................ 10 2004 052 678

(51) Int. Cl.
*H01L 29/94* (2006.01)
(52) U.S. Cl. .................. 257/331; 257/E29.262
(58) Field of Classification Search .......... 257/331, 257/E29.262
See application file for complete search history.

(56) References Cited

U.S. PATENT DOCUMENTS

| 4,941,026 | A | 7/1990 | Temple |
| 6,359,308 | B1 | 3/2002 | Hijzen et al. |
| 6,833,584 | B2 | 12/2004 | Henninger et al. |
| 2002/0185680 | A1 | 12/2002 | Henninger et al. |
| 2003/0001215 | A1* | 1/2003 | Wahl et al. .............. 257/401 |
| 2006/0006386 | A1 | 1/2006 | Hirler et al. |

FOREIGN PATENT DOCUMENTS

| DE | 101 27 885 A1 | 12/2002 |
| DE | 103 39 488 B3 | 4/2005 |

* cited by examiner

*Primary Examiner*—Bradley K Smith
*Assistant Examiner*—Amar Movva
(74) *Attorney, Agent, or Firm*—Maginot Moore & Beck

(57) ABSTRACT

A power trench transistor comprises a semiconductor body in which a cell array and an edge region surrounding the cell array are formed. First edge trenches are formed within the edge region. The first edge trenches contain field electrodes and the longitudinal orientations of the first edge trenches run from the cell array towards the edge of the trench transistor.

18 Claims, 6 Drawing Sheets

POWER TRENCH TRANSISTOR

BACKGROUND

The invention relates to a power trench transistor.

Power trench transistors serve for switching high currents and must therefore have good breakdown properties ("avalanche strength"). The breakdown properties of a power trench transistor are greatly dependent on the configurations of the edge region surrounding the cell array (the cell array generally comprises a plurality of transistor cells connected in parallel). There are usually formed within the edge region edge constructions which primarily serve for setting electric field strengths between the cell array and a sawing edge of the power trench transistor to specific values. In order to avoid a premature breakdown in the off state of the power trench transistor, the electric field strengths within the edge region are not permitted to exceed specific maximum field strength values. For this purpose, it is attempted to configure the power trench transistor (the edge constructions) such that, in the off state, corresponding equipotential lines are led from the interior of the edge region to the surface of the power trench transistor in such a way that excessively great potential gradients are avoided. The defined leading-outwards is referred to as "equipotential line management". Thus, by way of example, great curvatures and high equipotential line densities should be avoided since equipotential line profiles of this type may readily lead to undesirable breakdowns.

Premature breakdowns may occur in particular when power trench transistors are provided with additional drift zones (also referred to hereinafter as "epitaxial layer" or "pedestal epitaxial layer") in order to increase their maximum reverse voltage.

FIG. 1 shows a detail from a cell array of a field plate trench transistor 1 with an additional semiconductor layer. The field plate trench transistor 1 has a front side contact 2, a rear side contact 3 and also a semiconductor body 4 arranged between front side contact 2 and rear side contact 3. There are formed in the semiconductor body 4 an $n^+$-doped rear side connection zone 5, which usually serves as a carrier device, $n^+$-doped source regions 6, p-doped body regions 7, n-doped drift regions 8 and also an additional n-doped drift zone 9 (generally an epitaxial layer), the doping of which is lower than the doping of the drift regions 8. Furthermore, a trench 10 is formed in the upper region of the semiconductor body 4, a gate electrode 11 being provided in said trench. The gate electrode 11 is electrically insulated from the semiconductor body 4 by an insulation layer 12, which is configured in thickened fashion (field oxide layer) in the lower region. The gate electrode 11 is furthermore insulated from the front side contact 2 by an insulation layer 13. The gate electrode 11 simultaneously serves as a field electrode (lower part of the gate electrode 11) and depletes the highly doped drift regions 8 in the off-state case. Without the field electrode, not all the charges present in the drift regions 8 could be depleted in the off state of the field plate trench transistor 1, whereby the blocking capability of the field plate trench transistor 1 would be greatly restricted.

If the additional drift zone 9 is omitted, then a ring trench which encloses the cell array of the trench transistor 1 and is filled or lined with thick oxide generally suffices to guarantee a sufficient breakdown strength in the edge region of the trench transistor. In this case, it is sufficient if the dimensions (depth/width) of the ring trench correspond to the dimensions of the cell array trenches, that is to say that the width/depth of the ring trench must not be higher than the widths/depths of the cell array trenches.

The situation is different if, as shown in FIG. 1, an additional drift zone 9 is provided between the drift regions 8 and the rear side connection zone 5. In order to be able to ensure a satisfactory breakdown strength in this case, too, it is known to increase the width or depth of the ring trench, or to provide a plurality of ring trenches. What is disadvantageous in this case is that the formation of a widened or deepened ring trench is complicated from a process engineering standpoint.

It would be advantageous to specify an edge construction for a power trench transistor, in particular for a field plate trench transistor, which, even when an additional drift zone is present, guarantees a sufficient breakdown strength and, at the same time, can be produced in a simple manner in terms of process engineering.

SUMMARY

In one embodiment, a power trench transistor has a semiconductor body, in which a cell array having a plurality of trench transistor cells connected in parallel and an edge region surrounding the cell array are formed. First edge trenches are formed within the edge region, said first edge trenches containing field electrodes and the longitudinal orientations of said first edge trenches running from the cell array towards the edge of the trench transistor.

The concept disclosed herein can be applied in particular to a field plate trench transistor.

In one preferred embodiment, second edge trenches are formed in addition to the first edge trenches within the edge region, each second edge trench being situated opposite one of the corners of the cell array, and the longitudinal orientation of the second edge trenches running arcuately around the corresponding corner, that is to say forming a circle segment situated opposite the corresponding corner.

The widths and depths of the first and second edge trenches are advantageously chosen such that they substantially correspond to the widths and depths of the cell array trenches. It is thus possible to produce the edge trenches together with the cell array trenches in one process step.

In order to guarantee a sufficient breakdown strength, it is advantageous to combine the first and second edge trenches to form edge trench groups in such a way that those ends of the first edge trenches of an edge trench group which face the cell array have the same (lateral) distance with regard to the outer edge of the cell array.

Preferably, the totality of the first and second edge trenches of an edge trench group in each case forms an edge trench region enclosing the cell array. The edge trench regions accordingly form rings which are pervaded by the edge trenches and which enclose the cell array. The more these edge trench regions are provided one next to another, the higher the breakdown strength that can be achieved for the trench transistor.

In one preferred embodiment, the second edge trenches of an edge trench group may also run in part parallel to the cell array, that is to say that the second edge trenches are not only situated opposite the corners of the cell array, but are also situated opposite parts of the longitudinal/transverse sides of the cell array. This is particularly advantageous if metallization lines are intended to be led via the edge trench groups.

Preferably, the first edge trenches of an edge trench group run parallel to one another. Furthermore, the first edge trenches of one edge trench group should be offset relative to the first edge trenches of another edge trench group with regard to a direction running perpendicular to the longitudinal orientation of the first edge trenches. This guarantees that charges present in semiconductor regions between two edge trench regions that adjoin one another can be depleted better. As an alternative, the first edge trenches of different edge trench groups may also be connected to one another. In this case, the field plates of different edge trench groups should be insulated from one another.

The second edge trenches may be configured for example in such a way that a respective end of a second edge trench opens into a first edge trench of the same edge trench group.

The cell array may be enclosed at least partly by a ring trench arranged in such a way that first and second edge trenches lie outside the region enclosed by the ring trench. In this case, the ends of the first edge trenches which face the cell array may open into the ring trench. As an alternative, they may be spaced apart with regard to the ring trench. A field electrode insulated from the semiconductor body by an insulation layer is preferably provided within the ring trench.

The insulation layer may be configured in thickened fashion on the trench side remote from the cell array. As an alternative to this, the insulation layer may also be configured in thickened fashion on both trench sides.

In one preferred embodiment, the field electrodes of the same edge trench group are at the same potential and the field electrodes of different edge trench groups are at different potentials. For this purpose, the field electrodes of an edge trench group may be connected to one another by an electrically conductive connection, for example a metal interconnect.

Furthermore, the ends—facing the cell array—of the field electrodes which are provided within the first edge trenches may be electrically connected to regions of the semiconductor body which adjoin the first edge trenches. In this way, the potential of the field electrodes may be set to the potential prevailing in the regions of the semiconductor body which adjoin the first edge trenches.

Preferably, the ends—facing the cell array—of the field electrodes which are provided in the first edge trenches are electrically connected to floating semiconductor regions formed within the semiconductor body. If these floating semiconductor regions form pn junctions together with those semiconductor regions of the semiconductor body which adjoin them, then each field electrode assumes the local Fermi level of that region of the drift zone which adjoins the corresponding floating semiconductor region. The field electrode depletes that region of the drift zone which surrounds it in the off-state case and thereby increases the breakdown strength of the edge region. The field electrodes of different edge trench groups may "obtain" their potentials not only from floating (preferably p-type) regions but also from other sources, e.g. from zener diode chains or resistance voltage dividers, which may be connected e.g. between source and drain contact. The floating semiconductor regions of an edge trench group may be connected to one another. In one preferred embodiment, the totality of the floating semiconductor regions which are connected to one another form at least one segment of a floating semiconductor ring surrounding the cell array.

If a plurality of floating semiconductor rings (one semiconductor ring for each edge trench group) are formed in this way, then it is possible, for the sake of better charge depletion capability, for each floating semiconductor ring to be connected to the body region of the cell array via a depletable semiconductor region, the doping of this semiconductor region having the same doping as that of the body region (body regions).

A semiconductor region which is at source potential and whose doping corresponds to that of the body regions may furthermore adjoin that side of the ring trench which is remote from the cell array.

In one preferred embodiment, field electrodes electrically insulated from the semiconductor body by means of an insulation layer are formed above the first and second edge trenches. The field electrodes may be electrically connected to the field electrodes formed within the edge trenches, or to the floating semiconductor regions. The field electrodes may be composed for example of a metal or of polysilicon.

Further disclosed herein is a power trench transistor having a semiconductor body, in which a cell array and an edge region surrounding the cell array are formed. The edge region is formed by an edge trench containing a field electrode and extending from the cell array as far as at least to the end of the space charge zone (if appropriate as far as towards the edge of the trench transistor), the longitudinal orientation of the edge trench running parallel to the edge of the trench transistor.

Preferably, the source regions are n-doped, the body regions are p-doped and the drift regions are n-doped.

BRIEF DESCRIPTION OF THE DRAWINGS

The power trench transistor will be explained in more detail below in exemplary embodiment with reference to the figures, in which.

In the figures, identical regions, components and component groups are identified by the same reference numerals. Furthermore, all of the embodiments may be doped inversely, that is to say that n-type regions and p-type regions may be interchanged with one another.

DESCRIPTION

Figure 1:
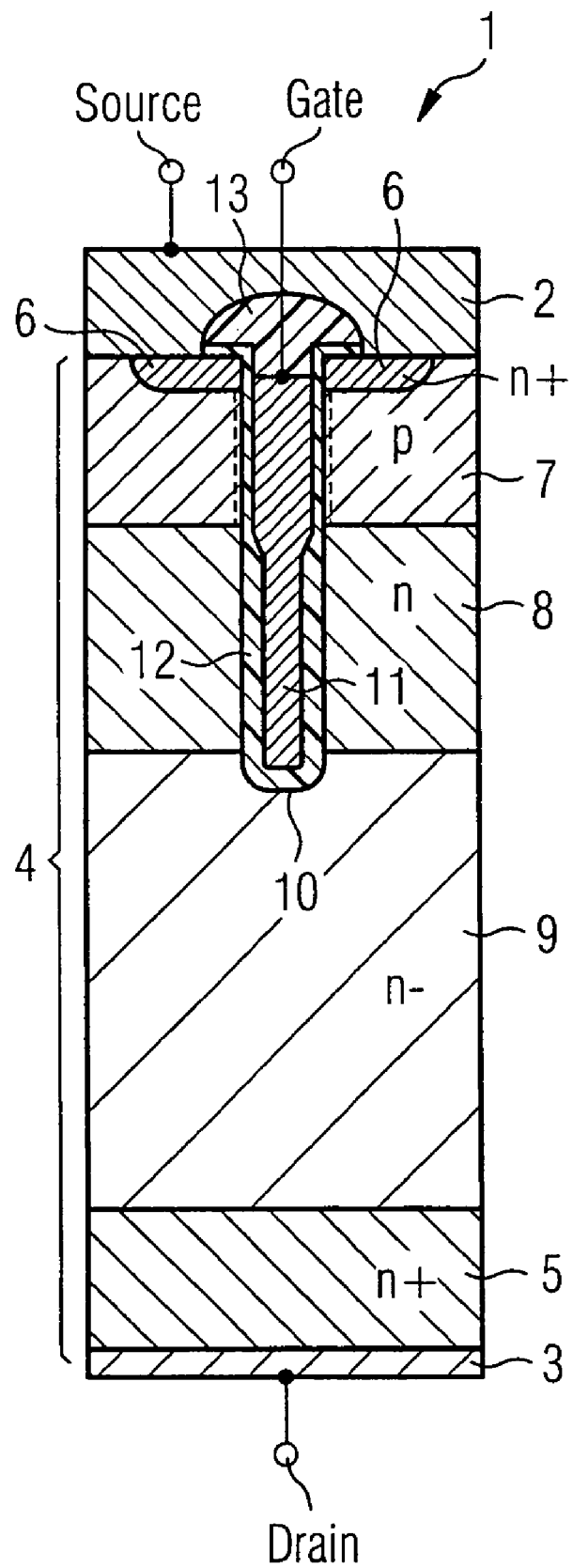
FIG. 1 shows a cross-sectional illustration of part of a known power trench transistor.

In the following description, a preferred embodiment of a power trench transistor will be explained in more detail with reference to FIGS. 3 and 4.

A trench transistor 100 has a front side contact 2 (source contact), a rear side contact 3 (drain contact), and a semiconductor body 4 arranged between front side contact 2 and rear side contact 3. There are formed in the semiconductor body 4 an n$^+$-doped rear side connection region 5, an n$^-$-doped epitaxial layer 9 (additional drift zone) arranged on the rear side connection region 5, and, on said layer in turn, an n-doped epitaxial layer 8 (drift region). Cell array trenches 10 are furthermore provided, the longitudinal orientation of which runs perpendicular to the plane of the drawing (in this embodiment, only one cell array trench can be seen). Gate electrodes 11 electrically insulated from the semiconductor body 4 by insulation layers 12 are provided within the cell array trenches 10. In this case, the insulation layers 12 are configured in thickened fashion in the lower region of the cell array trenches 10. A plurality of p-doped body regions 7 are provided in the drift region 8, n$^+$-doped source regions 6 in turn being incorporated into said body regions. By means of the gate electrodes 11, it is possible to generate vertical current flows from the source regions 6 through the body regions 7 into the drift regions 8.

Furthermore, a ring trench 14 is provided, which annularly surrounds the cell array. A field electrode 15 insulated from the semiconductor body 4 by an insulation layer 16 is formed within the ring trench 14. The insulation layer 16 is configured in thickened fashion on the trench side 17 remote from the cell array.

The power trench transistor 100 can accordingly be divided into a cell array 18 and also an edge region 19 surrounding the cell array 18. First edge trenches 20 are formed within the edge region 19, said first edge trenches containing field electrodes 21 and the longitudinal orientations of said first edge trenches running from the cell array 18 towards the edge 22 of the power trench transistor 100. The field electrodes 21 are electrically insulated from the semiconductor body 4 by an insulation layer 23. An insulation layer 31 is furthermore provided on the semiconductor body 4. The widths and depths of the first edge trenches 20 substantially correspond to the widths and depths of the cell array trenches 10.

Figure 4:
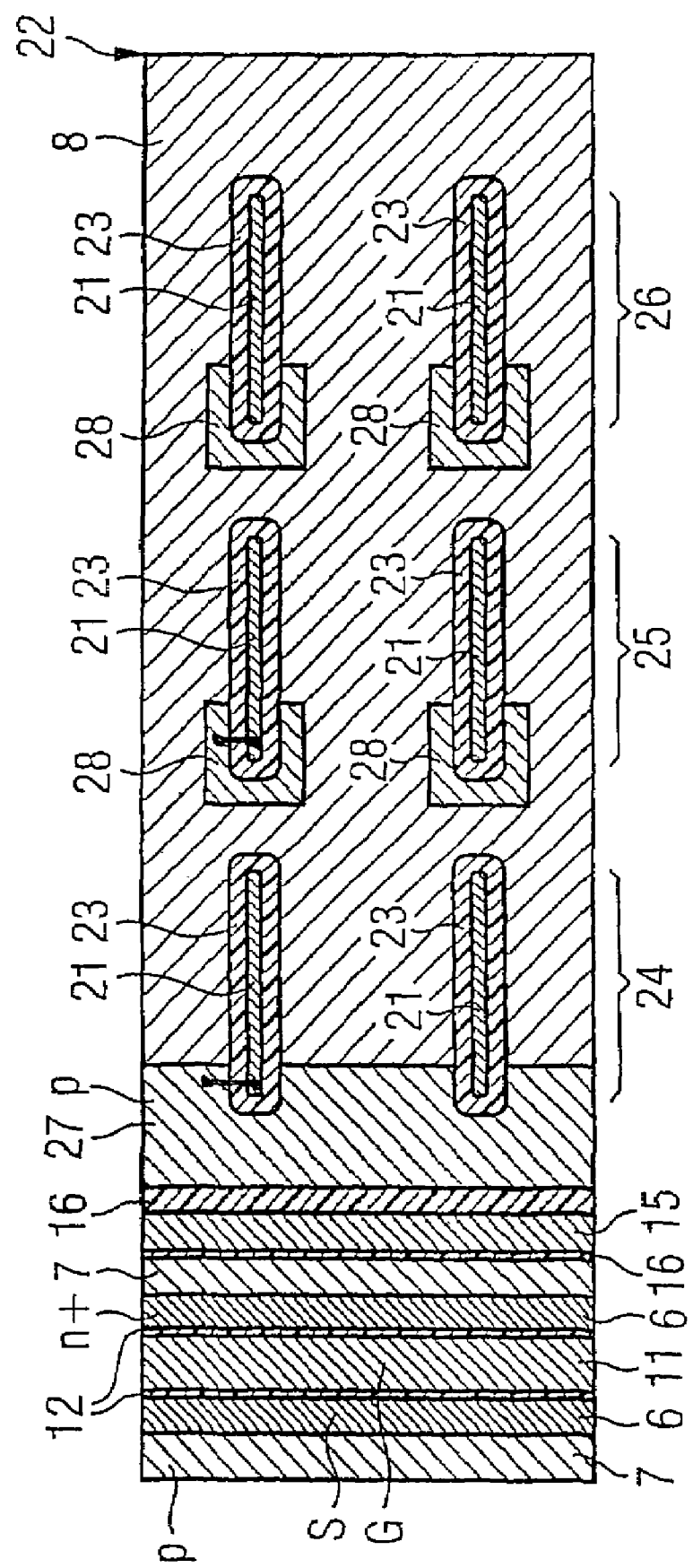
FIG. 4 shows a plan view of the embodiment shown in FIG. 3.

As can be gathered from FIG. 4, the first edge trenches can be combined to form edge trench groups 24, 25 and 26, all ends of the first edge trenches 20 of an edge trench group which face the cell array 18 having the same (lateral) distance with regard to the outer edge of the cell array 18. The edge trenches 20 of the first edge trench group 24, which lies closest to the cell array 18, are arranged in such a way that their ends facing the cell array are electrically connected to a p-doped semiconductor region 27 (via the front side contact 2). Analogously to this, those ends of the field electrodes 21 of the edge trench groups 25, 26 which face the cell array 18 are electrically connected to p-doped semiconductor regions 28 (via electrodes 29). Furthermore, p⁻-doped, depletable semiconductor regions 30 adjoining the p-doped semiconductor regions 28 are provided within the drift region 8. The voltage dropped at the pn junctions between the semiconductor regions 28 and the drift region 8 in the off state of the power trench transistor 100 has the effect that charge present in the semiconductor regions 28 and 30 can flow onto the field electrodes 21 via the electrodes 29. The potential change brought about as a result within the field electrodes 21 brings about a lowering of the potential gradients within the insulation layers 23, whereby the breakdown strength of the power trench transistor 100 can be improved further. The semiconductor regions 28 constitute floating semiconductor regions.

The electrodes 29 are preferably not set to a fixed potential, but rather serve merely as an electrical connection between the field electrodes 21. As can be seen in FIG. 4, the semiconductor regions of an edge trench group are not connected to one another. As an alternative, however, the semiconductor regions 28 could be "merged together" to form a contiguous semiconductor strip or a semiconductor ring or a semiconductor ring segment.

Figure 3:
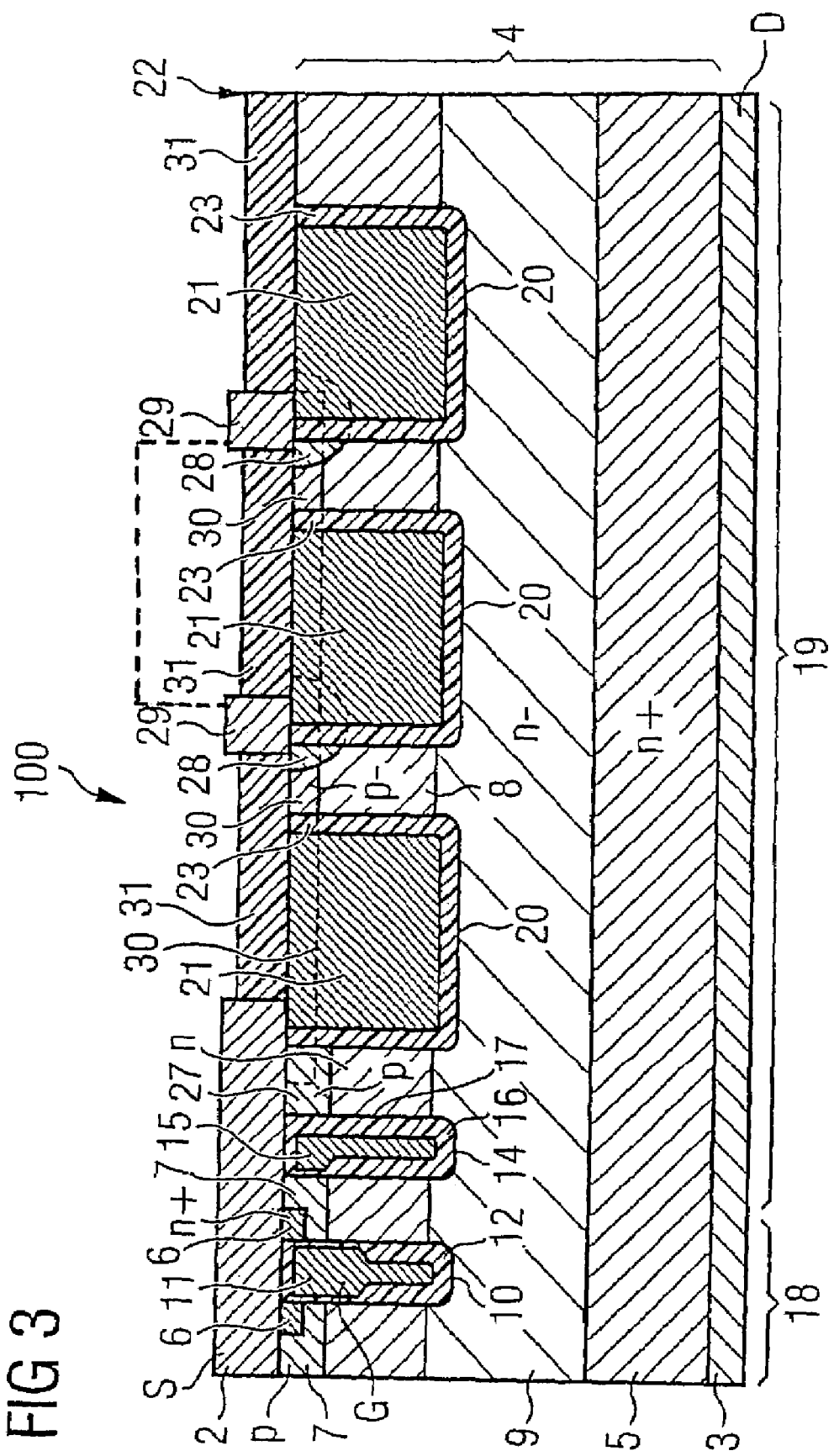
FIG. 3 shows a cross-sectional illustration of a second preferred embodiment of the power trench transistor.

As can be seen in FIG. 3, the p-doped semiconductor region 30 (dashed line) may be configured as a continuous, depletable semiconductor region that electrically connects the floating semiconductor regions 28 to the front side electrode 2. The semiconductor region 30 serves for discharging the field electrodes 21 again when the trench transistor 100 is switched on. The doping type of the semiconductor region 30 corresponds to the doping type of the body regions 7.

Figure 2:
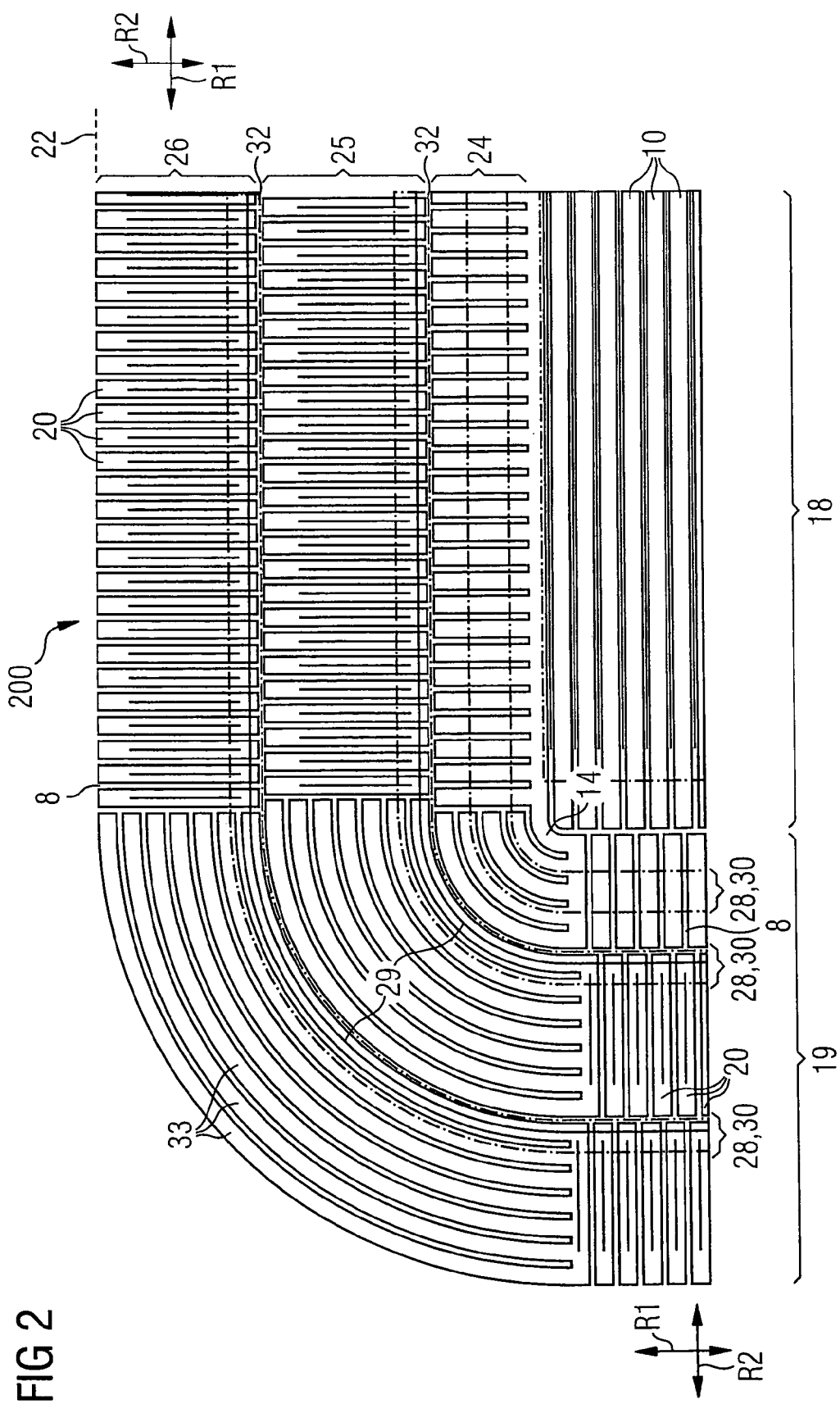
FIG. 2 shows a plan view of part of a first preferred embodiment of the power trench transistor.

FIG. 2 shows a plan view of a larger detail from a power trench transistor. A trench transistor 200 has a cell array 18 and also an edge region 19 surrounding the cell array 18. First edge trenches 20 are formed within the edge region 19, said first edge trenches being assigned to three edge trench groups 24, 25 and 26. The first edge trenches 20 run parallel to one another, but the edge trenches 20 of one edge trench group are offset relative to the edge trenches 20 of another edge trench group with regard to a direction R1 running perpendicular to the longitudinal orientation R2 of the first edge trenches. The advantage of first edge trenches 20 offset in this way is that free charge carriers can be better eliminated from semiconductor regions 32 between two edge trench groups in the off state. As an alternative, the first edge trenches 20 of the edge trench groups 24, 25 and 26 may also be connected to one another. In this case, the field plates 21 of different edge trench groups should be insulated from one another.

Each edge trench group 24, 25 and 26 is furthermore assigned second edge trenches 33, each second edge trench 33 being situated opposite one of the four corners of the cell array 18 and having an arcuate longitudinal orientation, with the result that an angle of 90° is spanned by each second edge trench 33. In this embodiment, one end of the second edge trenches 33 opens into a first edge trench 20 of the same edge trench group. This gives rise to "comblike" trench structures that mesh with comblike mesa structures ("mesa": the semiconductor region of the semiconductor body 4 which is situated between the edge trenches 20 or 33).

The second edge trenches 33 may also run along one or both longitudinal sides of the cell array 18 (that is to say along the directions R1, R2) parallel to the edge without any curvature, in order, for example, to enable an overlying gate line to be led out from the cell array into the edge region 19. The gate line is a metal interconnect on the chip surface, that is to say lies above an insulator that covers the silicon interface and also the trenches.

All of the field electrodes 21 within the first and second edge trenches 20, 33 of the edge trench group 25 are connected to one another via an electrode 29. The same applies to the edge trench group 26. Furthermore, the electrodes 29 are electrically connected to floating semiconductor regions 28 which extend annularly around the cell array 18.

The cell array 18 is furthermore surrounded by a ring trench 14, into which open those ends of the first edge trenches 20 of the edge trench group 24 which face the cell array 18.

Figure 6:
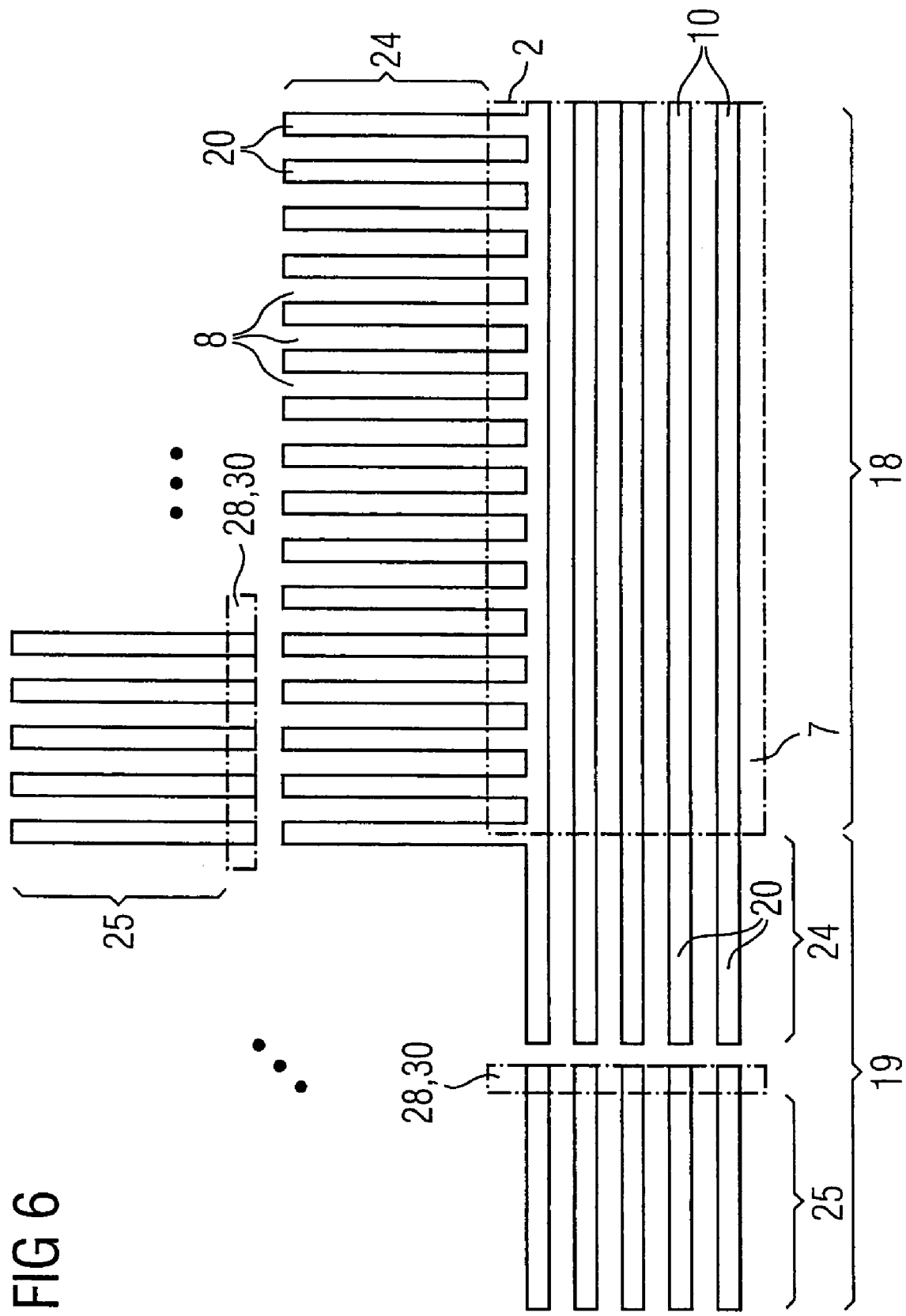
FIG. 6 shows a schematic plan view of part of a power trench transistor.

As is indicated in FIG. 6, the ring trench 14 can also be omitted. In this case, the first edge trenches 20 of the edge trench group 24 may open directly into a cell array trench 10 or be configured as lengthenings of the cell array trenches 10.

Figure 5:
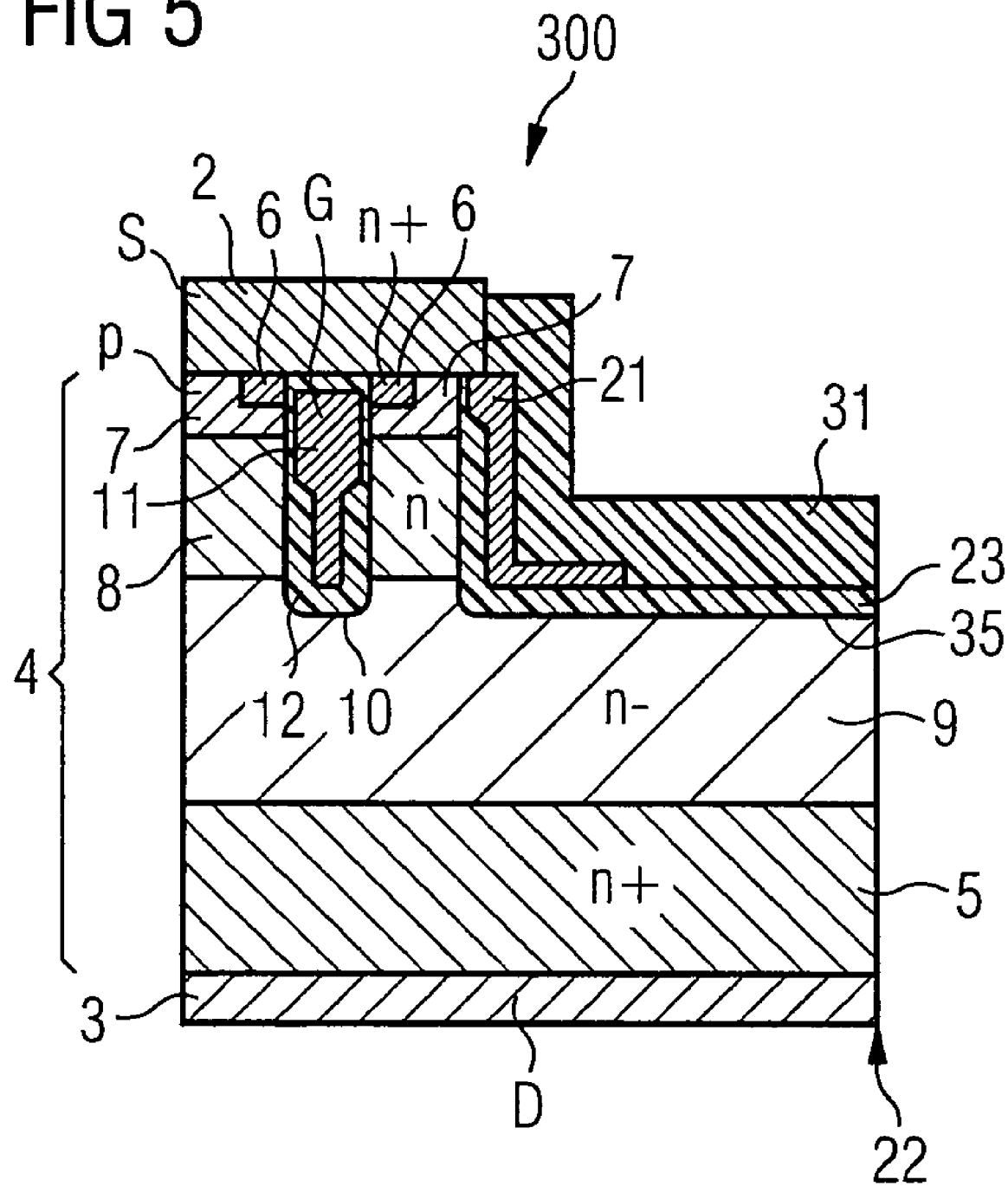
FIG. 5 shows a cross-sectional illustration of a third embodiment of the power trench transistor.

As can be gathered from FIG. 5, instead of a plurality of first edge trenches 20, provision may also be made of an individual edge trench 35 running at least partly around the cell array 18, which edge trench may extend as far as towards the edge (sawing track) of the trench transistor 300. In this embodiment, only one field electrode 21 is provided, which is connected to the front side contact 2, is insulated from the semiconductor body by an insulation layer 23 and extends at least partly in the direction of the edge 22 of the trench transistor 300. The field electrode 21 is preferably configured in annular fashion in this embodiment.

Further aspects of the power trench transistor disclosed herein will be explained below:

The dielectric strength of a vertical field plate trench transistor can be increased further by means of an additional pedestal epitaxial layer without having to increase the trench depth and the field oxide thickness in the trench (see, for example, document US 04941026A1). For this purpose, below the epitaxial layer, which is essentially pierced by the trenches, a second, more lightly doped epitaxial layer is provided, which can take up a further space charge zone.

Whereas in a field plate trench without a pedestal epitaxial layer, the edge termination can be integrated (see, for example, document DE 10127885 A1) into the last cell array trench in the form of a thick oxide (which is provided at least on the outer side of the trench), it is necessary, when using a pedestal epitaxial layer, for the voltage dropped in the pedestal epitaxial layer also to be reduced in the lateral direction alongside the edge trench, in particular also in a highly doped "upper" semiconductor layer (epitaxial layer) which forms an upper part of the semiconductor body of the trench transistor.

According to one embodiment, use is made of a cascade of trenches extending in the lateral direction from the source region towards the edge. In this case, the mesa regions between the trenches must be depletable, that is to say that the charge present between two trenches or the charge present at crossovers between a plurality of trenches are not permitted to exceed the breakdown charge, as in the cell array. It follows from this that the width of the mesa regions must be substantially equal to the width of the mesa regions in the cell array. Since the thicknesses of the field oxide layers are generally identical in all the trenches (since this makes it possible to bring about a simple production process) and it is thus not always possible for the complete drain-source voltage to be reduced by the field oxide in the edge trenches, the field electrodes in the cascades must be at a respectively higher voltage. For this purpose, the field plates may be connected to floating p-type regions at the source end of the trench. Furthermore, at cell array edge trenches which run parallel to the edge and prevent the current flow to the source electrode, provision is made of a body region on the outer side of the cell array at source potential as close as possible to these trenches. It is optionally possible to provide e.g. a depletable p-type region at the surface of the edge construction, which region conductively connects the floating p-type regions in the switched-on case to a body region (at source potential) adjoining the cell array, in order to permit the charge to flow away from the field plates in the event of switch-on. A lateral voltage drop can be generated by means of the laterally running trenches.

The final cell array trench (ring trench) may be covered with thick oxide on both sides or only on the outer side on the entire sidewall. If a p-type region which is adjacent to the cell array edge trench and is connected to source potential is present in the edge region, then the cell array edge trench may also have gate oxide (that is to say a thinned insulation layer) on both sides in the upper region.

In order to avoid cruciform mesa regions, the cascaded trench series can be offset, thereby giving rise to T portions, which can be depleted more easily.

It is also possible, of course, to provide a plurality of electrodes in one trench both one above another and one next to another.

If the intention is to realize lines or pads above the edge regions (e.g. lines connecting gate electrodes provided in cell array trenches to gate pads in the edge region), then it is possible to use mesa and trench strips running parallel to the edge, which are connected at one side and intermesh in comb-like fashion, as is shown in FIG. 2.

The edge trenches may begin at a trench running parallel to the edge, or be configured as an extension of the cell array.

The doping of the upper region of the semiconductor body may decrease outwards (towards the edge) or generally be made lower in the edge region than within the cell array.

A further possible edge termination is a CoolMOS edge termination. In this case, p-type regions are provided in the highly doped upper epitaxial layer and compensate for the charges in the n-type regions. The width of the n-type regions must be comparable with the mesa width, because otherwise the n-type regions can no longer be depleted. The p-type regions may be configured such that they are depletable or non-depletable. An edge termination of this type can be combined with the edge termination.

Furthermore, it is possible to etch through one or both epitaxial layers in the entire edge region. In the case where only the upper epitaxial layer is etched away, a known edge termination such as JTE, p-ring edge, field plate edge or others may be used on the lower epitaxial layer. The process of etching through the upper epitaxial layer may be effected at the same time as the trench etching for the cell array.

LIST OF REFERENCE SYMBOLS 1, 100, 200, 300 Trench transistor
2 Front side contact
3 Rear side contact
4 Semiconductor body
5 Rear side connection zone
6 Source region
7 Body region
8 Drift region
9 Additional substrate layer
10 Cell array trench
11 Gate electrode
12, 13 Insulation layer
14 Ring trench
15 Field electrode
16 Insulation layer
17 Trench side
18 Cell array
19 Edge region
20 First edge trench
21 Field electrode
22 Edge
23 Insulation layer
24, 25, 26 Edge trench group
27, 28 Semiconductor region
29 Electrode
30 Semiconductor region
31 Insulation layer
32 Region
33 Second edge trench
34 Semiconductor region
35 Edge trench
R1 Direction perpendicular to the longitudinal direction of the first edge trenches
R2 Longitudinal direction of the first edge trenches

What is claimed is:

1. A power trench transistor including a semiconductor body, the power trench transistor comprising:
   a cell array having a longitudinal side and a traverse side; and
   an edge region surrounding the cell array with first edge trenches formed within the edge region, and field electrodes formed within said first edge trenches, wherein the longitudinal orientations of said first edge trenches along the longitudinal side of the cell array run substantially perpendicular to the longitudinal side of the cell array, and wherein the longitudinal orientations of first edge trenches along the transverse side of the cell array run substantially perpendicular to the transverse side of the cell array.

2. The trench transistor of claim 1 further comprising second edge trenches formed within the edge region, said second edge trenches being positioned opposite at least one corner of the cell array, and the longitudinal orientations of said second edge trenches running arcuately around a corresponding corner.

3. The trench transistor of claim 2 wherein the widths and depths of the first edge trenches and second edge trenches substantially correspond to the widths and depths of cell array trenches in the cell array.

4. The trench transistor of claim 2 wherein the first edge trenches and second edge trenches are combined to form edge trench groups, wherein ends of the first edge trenches of an edge trench group which face the cell array have the same lateral distance with regard to the outer edge of the cell array.

5. The trench transistor of claim 4 wherein the totality of the first edge trenches and second edge trenches of an edge trench group in each case forms an edge trench region enclosing the cell array.

6. The trench transistor of claim 5 wherein the first edge trenches of one edge trench group run parallel to one another and are offset relative to the first edge trenches of another edge trench group with regard to a direction running perpendicular to the longitudinal orientation of the first edge trenches.

7. The trench transistor of claim 6 wherein a respective end of one of the second edge trenches opens into one of the first edge trenches of the same edge trench group.

8. The trench transistor of claim 2 wherein the cell array is enclosed by a ring trench, and wherein the first edge trenches and second edge trenches lie outside a region enclosed by the ring trench.

9. The trench transistor of claim 8 wherein ends of the first edge trenches which face the cell array open into the ring trench.

10. The trench transistor of claim 8 wherein a field electrode is insulated from the semiconductor body by an insulation layer which is provided within the ring trench.

11. The trench transistor according to claim 10 wherein the insulation layer is configured in a thickened fashion on the side of the ring trench remote from the cell array.

12. The trench transistor of claim 4 wherein the field electrodes of different edge trench groups are at different potentials.

13. The trench transistor of claim 4 wherein the field electrodes of an edge trench group are connected to one another by an electrically conductive connection.

14. The trench transistor of claim 1 wherein the ends of the field electrodes formed in the first edge trenches which face the cell array are electrically connected to regions of the semiconductor body which adjoin the first edge trenches.

15. The trench transistor of claim 14 wherein the ends of the field electrodes formed in the first edge trenches which face the cell array are electrically connected to floating semiconductor regions formed within the semiconductor body.

16. The trench transistor according to claim 15 wherein the floating semiconductor regions form at least one segment of a floating semiconductor ring surrounding the cell array.

17. The trench transistor of claim 16 wherein the floating semiconductor ring is connected to a body region of the cell array via a semiconductor region of the same doping.

18. Power trench transistor including a semiconductor body, the power trench transistor comprising:
 a cell array having longitudinal and traverse sides; and
 an edge region surrounding the cell array with first edge trenches and second edge trenches formed within the edge region, the first edge region including field electrodes formed therein, the first edge trenches having a longitudinal orientation that runs away from the longitudinal and traverse sides of the cell array to an edge of the trench transistor substantially perpendicular to said longitudinal and traverse sides of the cell array and to the edge of the transistor, and said second edge trenches being positioned opposite at least one corner of the cell array and having an arcuate shape that runs substantially parallel to a corresponding arcuate edge of the transistor.

* * * * *